United States Patent

Carpenter et al.

[11] Patent Number: 5,862,149
[45] Date of Patent: Jan. 19, 1999

[54] METHOD OF PARTITIONING LOGIC DESIGNS FOR AUTOMATIC TEST PATTERN GENERATION BASED ON LOGICAL REGISTERS

[75] Inventors: Shawn R. Carpenter, Minneapolis; Thomas S. Valind, New Brighton, both of Minn.

[73] Assignee: Unisys Corporation, Blue Bell, Pa.

[21] Appl. No.: 726,332

[22] Filed: Oct. 3, 1996

Related U.S. Application Data

[63] Continuation of Ser. No. 520,525, Aug. 29, 1995.

[51] Int. Cl.$^6$ .................................................. G01R 31/28
[52] U.S. Cl. .......................... 371/22.3; 371/27; 364/490
[58] Field of Search ................................ 371/22.1, 22.2, 371/22.3, 22.4, 22.5, 22.6, 24, 25.1, 26, 27; 364/488, 489, 490–491

[56] References Cited

U.S. PATENT DOCUMENTS

| | | | |
|---|---|---|---|
| 4,317,200 | 2/1982 | Wakatsuki et al. | 371/25 |
| 5,113,352 | 5/1992 | Finnerty | 364/490 |
| 5,187,712 | 2/1993 | Malleo-Roach et al. | 371/22.1 |
| 5,251,147 | 10/1993 | Finnerty | 364/490 |
| 5,257,201 | 10/1993 | Berman et al. | 364/489 |
| 5,278,842 | 1/1994 | Berry, Jr. et al. | 371/22.3 |
| 5,331,570 | 7/1994 | Bershteyn | 364/489 |
| 5,377,197 | 12/1994 | Patel et al. | 371/23 |
| 5,379,303 | 1/1995 | Levitt | 371/27 |
| 5,410,552 | 4/1995 | Hosokawa | 371/27 |
| 5,457,697 | 10/1995 | Malleo-Roach et al. | 371/22.3 |
| 5,524,082 | 6/1996 | Horstmann et al. | 364/489 |
| 5,544,173 | 8/1996 | Meltzer | 371/22.3 |

OTHER PUBLICATIONS

P.D. Noakes, Ch. 8 "An introduction to testing and design for test techniques" from 'Design & Test Techniques for VLSI & WSI Circuits,' pp. 723–743.

*Primary Examiner*—Robert W. Beausoliel, Jr.
*Assistant Examiner*—P. Vales
*Attorney, Agent, or Firm*—Charles A. Johnson; Mark T. Starr

[57] ABSTRACT

A method used by an electronic design automation system for partitioning the logic design of an integrated circuit and generating test patterns for testing the integrated circuit. The logic design of the integrated circuit includes a gate-level description having components and nets. Nets include base nets input to the integrated circuit and apex nets output from the integrated circuit. The nets are specified by vector net notation. The method includes creating a plurality of cones of logic design from the logic design of the integrated circuit. Each cone is defined by tracing a path from an apex net, defined by a logic designer, output from a logical register of the logic design to a logic designer-defined base net affecting the logical register. A test pattern is then automatically generated for each of the traced cones of logic design. Logic cone tracing and partitioning the logic design of integrated circuits according to logical registers specified by vector net notation decreases automatic test pattern generation time in an electronic design automation system.

9 Claims, 12 Drawing Sheets

METHOD OF PARTITIONING LOGIC DESIGNS FOR AUTOMATIC TEST PATTERN GENERATION BASED ON LOGICAL REGISTERS

This is a continuation of copending application Ser. No. 08/520,525 filed on Aug. 29, 1995.

BACKGROUND OF THE INVENTION

1. Field of the Invention

This invention relates generally to electronic design automation (EDA) systems used for designing complex integrated circuits. The invention is more specifically related to a method of partitioning logic designs for improved automatic test pattern generation (ATPG) during the integrated circuit design process.

2. Background Information

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the integrated circuit chip in an appropriate machine-readable form. Chip designers generally employ hierarchical design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

Two common methods for specifying the integrated circuit design are schematic capture and hardware description languages. Both of these methods allow a circuit designer to specify the circuit at the register transfer level (also known as a "behavior description"). The schematic capture method provides a sophisticated user interface which allows a logic circuit to be drawn in graphical form on a computer display. The design is often specified with standard logic symbols such as NAND gates and NOR gates. Using this method, the circuit is defined in small building blocks. The names of the building blocks are specified by the circuit designer. Thus, they usually are logical names with specific functional meaning.

Encoding the design in a hardware description language (HDL) is the other major design entry technique used to specify modern integrated circuits. Hardware description languages are specially developed to aid a designer in describing a circuit. These languages often contain specific functions and syntax to allow complex hardware structures to be described in a compact and efficient way. The HDL program specifying the design may be compiled into the same data format produced by schematic capture, thereby providing a designer great flexibility in methods used for specifying a logic design.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a standard cell library. A cell library is a database containing detailed specifications on the characteristics of each logical component available for use in a design. Initial cell library contents are usually provided by the chip vendor. The components in the cell library are identified by the generic description of the component type. For example the term "NAND" for a NAND gate is its type description and distinguishes this component from others such as OR gates, flip-flops, multiplexors, and so on. A two-input NAND gate might be of type 2NAND.

When a particular 2NAND component is specified as part of a given circuit design, it is given an instance name, to distinguish it from all other 2NAND gates used in the circuit. The instance name typically includes the instance names of all parent instances by concatenation when defining the instance in the context of the chip. A single name is sufficient when dealing only in the context of a single user function. The user-defined blocks can then be used to design larger blocks of greater complexity. The user-defined blocks are added to the design library, which grows from the additions of new design modules as the design evolves. The top level of the design hierarchy will be a single block that defines the entire design, and the bottom layer of the hierarchy will consist of leaf cells, the cells (i.e., the logical components) that were originally provided in the cell library. Note that the hierarchy is typically structured as a special kind of a graph called a tree. This resulting data structure is called a detailed or gate-level) description of the logic design.

The generation of the detailed description is accomplished by logic design synthesis software. The logic design synthesis software generates a gate-level description from the behavior or register transfer level description of the design. This gate level description references a silicon vendor's library cells as the leaf or bottom level nodes in the integrated circuit design. Constituent parts of new gate-level logic created luring each pass through the logic design synthesis software are given computer-generated component and net names. Each time the logic design synthesis software is executed for the integrated circuit design, the component and net names which are generated by the software, and not explicitly controlled by the user, may change, depending on whether new logic has been added to or deleted from the original behavior level description of the circuit. Typically, the logic design synthesis software is executed many times during the integrated circuit design process, because errors may be detected during the simulation and testing phases of the design cycle and then fixed in the behavioral description.

The output of the design capture and synthesis tools is a logic design database which completely specifies the logical and functional relationships among the components of the design. Once the design has been converted into this form, it may be optimized by sending the logic design database to a logic optimizer tool implemented in software. The logic optimizer removes logic from the design that is unnecessary.

It is also necessary to verify that the logic definition is correct and that the integrated circuit implements the function expected by the circuit designer. This verification is currently achieved by timing and simulation software tools. The design undergoes design verification analysis in order to detect flaws in the design. The design is also analyzed by simulating the device resulting from the design to assess the functionality of the design. If errors are found or the resulting functionality is unacceptable, the designer modifies the behavior description as needed. These design iterations help to ensure that the design satisfies its requirements.

After timing verifications and functional simulation have been completed on the design, placement and routing of the design's components are performed. These steps involve allocating components of the design to locations on the integrated circuit chip and interconnecting the components to form nets.

After the integrated circuit is manufactured, and prior to shipping to users, the circuit is electronically tested by a computerized tester to verify that no faults exist in the circuitry. Once an integrated circuit has been packaged, it must be treated as a black box having a finite number of inputs and outputs. Unlike a printed circuit board, access cannot be obtained to intermediate points in the circuit unless they are brought out to one of the package pins. The operation of testing requires that certain input conditions are applied to the circuit and the resultant output conditions are compared with those predicted by simulation or those generated by a known good circuit to which the same input conditions are applied.

Testing a digital circuit requires that the circuit is exercised in such a way as to validate its required functionality and identify any faults present in the circuit. Faults within a circuit can take many physical forms and be produced by a variety of problems during processing and operation. For many physical faults, the terminal effect of these faults is modelled by the stuck-at fault model. A circuit node is said to be stuck-at-0 or stuck-at-1 if the application of a pattern at the primary inputs which should drive the node to a logic 1 or logic 0 level fails to produce the expected change at the output. Functional testing of a digital integrated circuit is concerned with verifying that when a particular pattern or sequence of patterns is applied to its inputs, it will produce the desired pattern or sequence of patterns at its outputs. Ideally, the applied patterns should exercise each internal node of the circuit in order to establish whether one or more stuck-at faults exist. The two stages of establishing an appropriate set of test stimuli include generating a set of test vectors or test patterns, and evaluating the fault coverage of the set.

When generating sets of test patterns, it is usually assumed that a single stuck-at fault is present in the circuit. Assuming that a particular node is stuck-at 0 or 1, a combination of inputs is selected which will cause this node to be set to the opposite (1 or 0), fault-free state. Other inputs are set so as to propagate the state of the node being tested to one or more primary outputs so that its condition can be observed. Manual generation of appropriate sequences of input patterns to exercise all of the nodes in a complex integrated circuit is impractical. Hence, automatic test pattern generation (ATPG) mechanisms were developed. In combinational circuits, where the current output state depends only on the current state of the inputs, it is possible to perform exhaustive testing by applying all possible combinations of inputs to the circuit, in order to verify the circuit's truth table. Unfortunately, the time taken to perform this type of test becomes excessive as the number of inputs increases. In practice, the presence of a stuck-at fault at every node can be detected using a reduced, carefully chosen set of test patterns, resulting in a significantly smaller test time. Typically, however, circuits will include one or more feedback loops and a number of bistable storage elements. For this type of circuit, an exhaustive test is likely to be even more impractical because of the need to check the sequential operation for all possible sequences of combinations of input patterns to the storage elements.

Various methods of deterministic generation of non-exhaustive test sets are known in the prior art. These methods usually produce a reduction in the size of the test set while providing maximum fault coverage. These methods have been implemented in software to form the basis of current automatic test pattern generation (ATPG) programs. As the test pattern generation task for a large integrated circuit is non-trivial, ATPG programs often require many hours of CPU time to produce a set of test patterns with acceptable fault coverage. The overall objective is to spend the smallest amount of time generating a minimal set of test patterns which will give the maximum fault coverage. A minimal set of test patterns is one which can be applied by automatic test equipment in a reasonable test time. Clearly a technique which significantly decreases the time required to produce an acceptable set of test patterns would advance the state of the art.

SUMMARY OF THE INVENTION

An object of this invention is to decrease the time required to generate an acceptable set of test patterns for an integrated circuit.

Another object of this invention is to decrease the time required for executing an automatic test pattern generation (ATPG) algorithm within an electronic design automation (EDA) system as part of the integrated circuit design and test cycle.

A further object of this invention is to trace one or more cones of logic more efficiently by collectively tracing all bits of a logical register in an integrated circuit design instead of individually tracing bits from all flip-flops comprising a logical register.

A still further object of this invention is to generate more comprehensible ATPG reports by partitioning the logic design of an integrated circuit in order to generate test pattern lists organized by logical registers rather than by individual flip-flops.

Yet another object of this invention is to decrease the overall time spent generating test patterns for an integrated circuit by partitioning the logic design of an integrated circuit into multiple partitions having one or more cones of logic, each cone of logic representing a logical register, and generating test patterns for each of the individual partitions.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the Drawings and Description of the Preferred Embodiment, with the scope and aspects of the invention defined in the appended claims.

According to the present invention, the foregoing and other objects and advantages are attained by a novel method for partitioning the logic design of an integrated circuit and generating test patterns for testing the integrated circuit. The steps of the method include creating a plurality of cones of logic design from the logic design of the integrated circuit and automatically generating test patterns for each one of the plurality of cones. Each cone of logic design includes a section of the logic design of the integrated circuit defined by a path from at least one logic designer-defined apex to at least one logic designer-defined base affecting the logical register. An apex is either an internal flip-flop or ASIC output pin. A base is either an internal flip-flop or ASIC input pin. Partitioning of the integrated circuit design is based on logical registers, identified in vector notation, rather than individual internal states or flip-flops. Partitioning the logic design in this manner minimizes the time spent generating the test patterns.

Still other objects and advantages of the present invention will become readily apparent to those skilled in the art from the following detailed description, wherein is shown and described only the preferred embodiment of the invention, simply by way of illustration of the best mole contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive, and what is intended to be protected by Letters Patent is set forth in the appended claims.

DESCRIPTION OF THE PREFERRED EMBODIMENT

Figure 1:
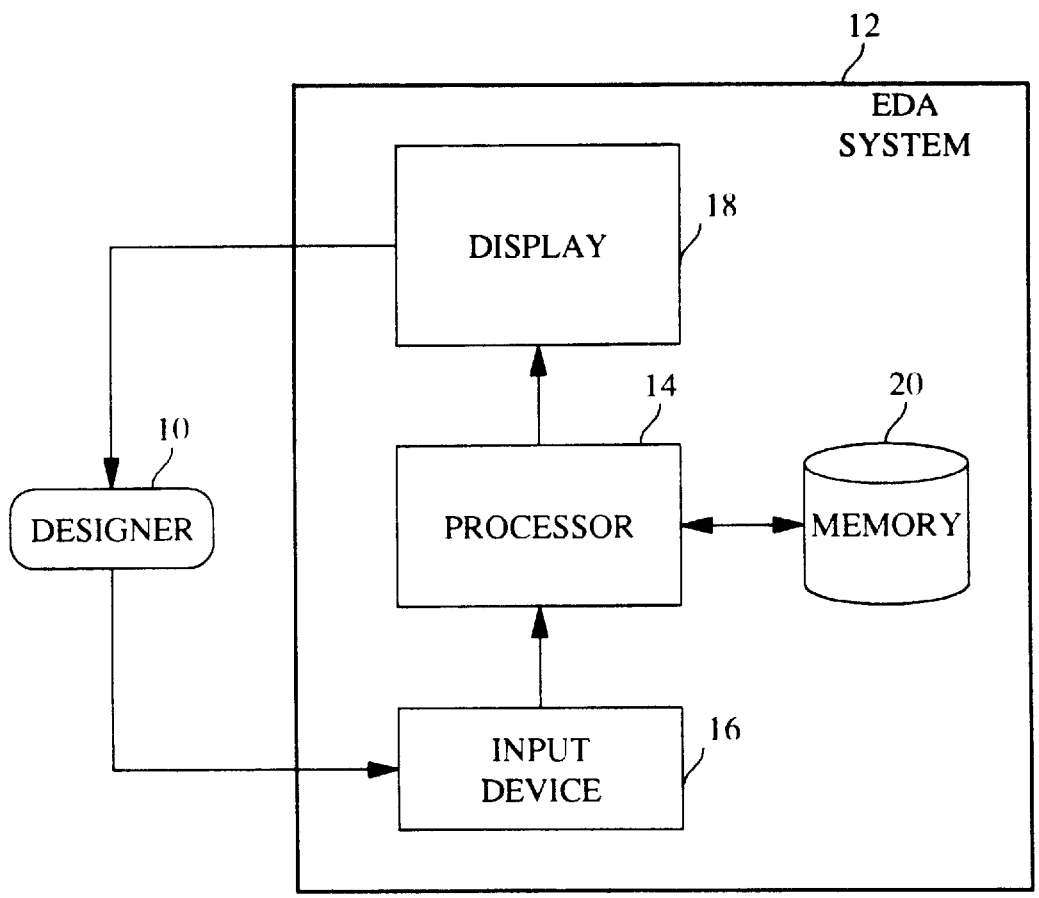
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts ton most effectively convey the substance of their work to others skilled in the art.

An algorithm is here, generally, conceived to be a self-consistent sequence of steps leading to a desired result. These steps are those requiring physical manipulations of physical quantities. Usually though not necessarily, these quantities take the form of electrical or magnetic signals capable of being stored, transferred, combined, compared and otherwise manipulated. It proves convenient at times, principally for reasons of common usage, to refer to these signals as bits, values, elements, symbols characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1 is a block diagram of the computer-based environment of the present invention. A Designer 10 interacts with an electronic design automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment the EDA System is a HP 1097C Series 700 engineering workstation, commercially available from Hewlett-Packard Corporation, although other engineering workstations or computer systems from manufacturers such as Sun Microsystems, Inc., may also be used. The Designer 10 enters design information into the EDA System by using a well-known Input Device 16 such as a mouse, a keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command moles, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to the logic design in Memory 20. The Memory may take the form of a semiconductor memory, magnetic disks, optical disks, magnetic tape or other mass storage device.

Figure 2:
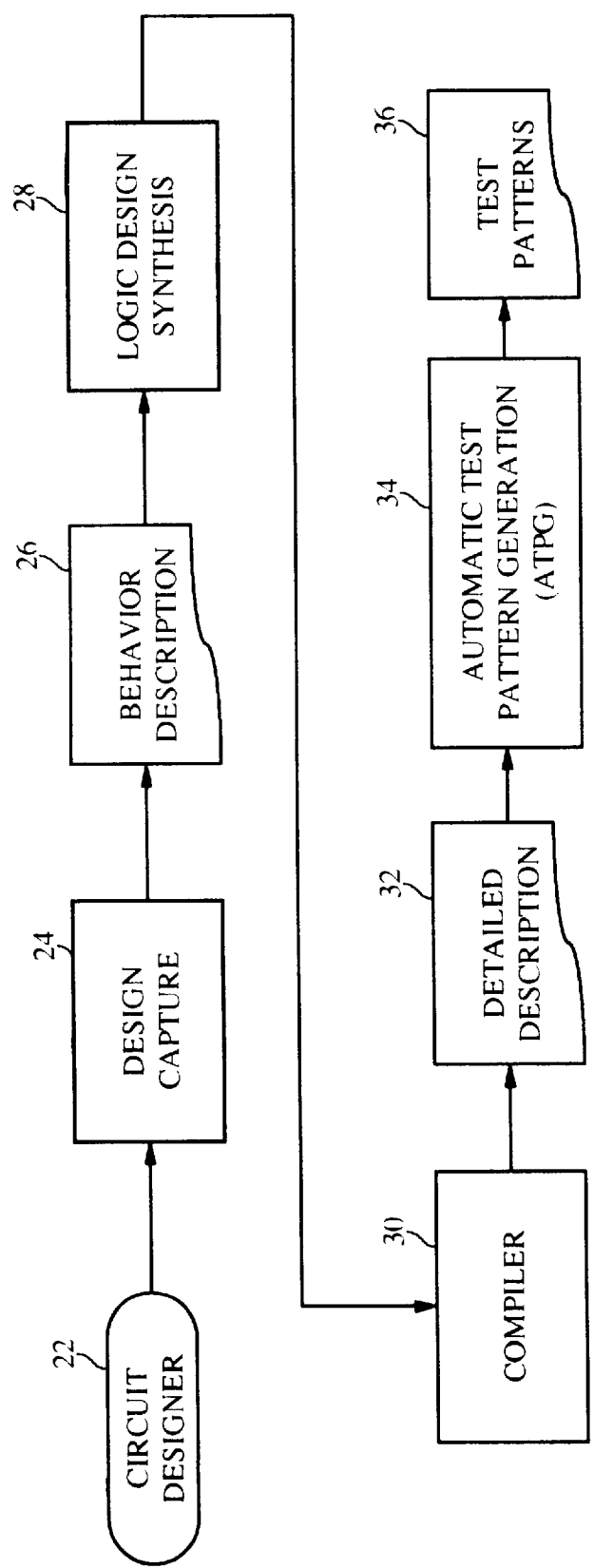
FIG. 2 is a block diagram of the process environment of the present invention.

FIG. 2 is a block diagram of the process environment of the present invention. The Circuit Designer 22 specifies the logic design of an integrated circuit by using Design Capture software 24. The Hardware Computer-Aided Design System (HCADS), available from Unisys Corporation may be used as Design Capture software 24, although other design capture programs from companies such as Cadence Design Systems, Inc., Synopsis, Inc., and Mentor Graphics. Inc., are also commercially available. The result of this activity is a Behavior Description file 26. The Behavior Description represents the logic design as specified at the register transfer level. Items in the Behavior Description file map to functional components of the design. Each component has a logical name assigned to it by the Circuit Designer 22. The Behavior Description may be written in a design language called Universal Design Source Language (UDSL), which is proprietary to Unisys Corporation, although other existing, well-known hardware design languages could also be used. The Behavior Description is input to Logic Design Synthesis software 28. Logic Design Synthesis software 28 creates the gates and other circuitry needed to implement the design specified by the Behavior Description. The Synthesis software comprises the Behavior to Structure Translator (BEST) synthesis tool developed by Unisys Corporation. However, alternate embodiments such as the VHDL Design Compiler commercially available from Synopsis, Inc., the Design-Book synthesis tool from Escalade, and the Synergy synthesis tool available from Cadence Design Systems, Inc., may also be used. The Logic Design Synthesis software 28 works in conjunction with Compiler 30 to generate the Detailed Description file 32. This file contains the gate-level definition of the logic design. The Detailed Description file 32 is in Behavior Description Language (BDL) format.

The Detailed Description file 32 is input to a variety of other EDA software tools, only one of which is shown in FIG. 2. Other EDA software tools include placement and routing tools, timing analyzers, and simulation programs. The Detailed Description 32 is sometimes referred to as the netlist for the design. The Detailed Description 32 is input to the Automatic Test Pattern Generation (ATPG) 34 process. The ATPG process generates Test Patterns 36, which are input to computerized test equipment (not shown in FIG. 2) for testing the manufactured integrated circuit.

The use of test patterns may be explained by a simple example. If the logic design consists of a burn map for a small programmable integrated circuit chip (for example, a 20-pin programmable logic array (PLA), the ATPG 34 generates a list of input combinations which will exercise all of the logic within the chip. After the chip is burned with the logic design, a computerized tester applies the requisite combinations of voltage levels to the chip's input pins. The tester verifies that the expected logic levels appear on the output pins. If an unexpected pattern appears on the output pins, the chip is most likely either defective, or burned incorrectly.

In larger designs e.g., a large application specific integrated circuit (ASIC)), far too many levels of logic exist in the design to use test patterns in this way. Instead, the design must be decomposed into smaller sections of combinational logic bounded on either side by flip-flops and ASIC pins. These sections are called "cones". More formally, a cone is a section of an integrated circuit design defined by a path from at least one logic designer-defined apex to at least one logic designer-defined base affecting the apex. An apex is either an internal flip-flop or ASIC output pin. A base is either an internal flip-flop or ASIC input pin.

Figure 3:
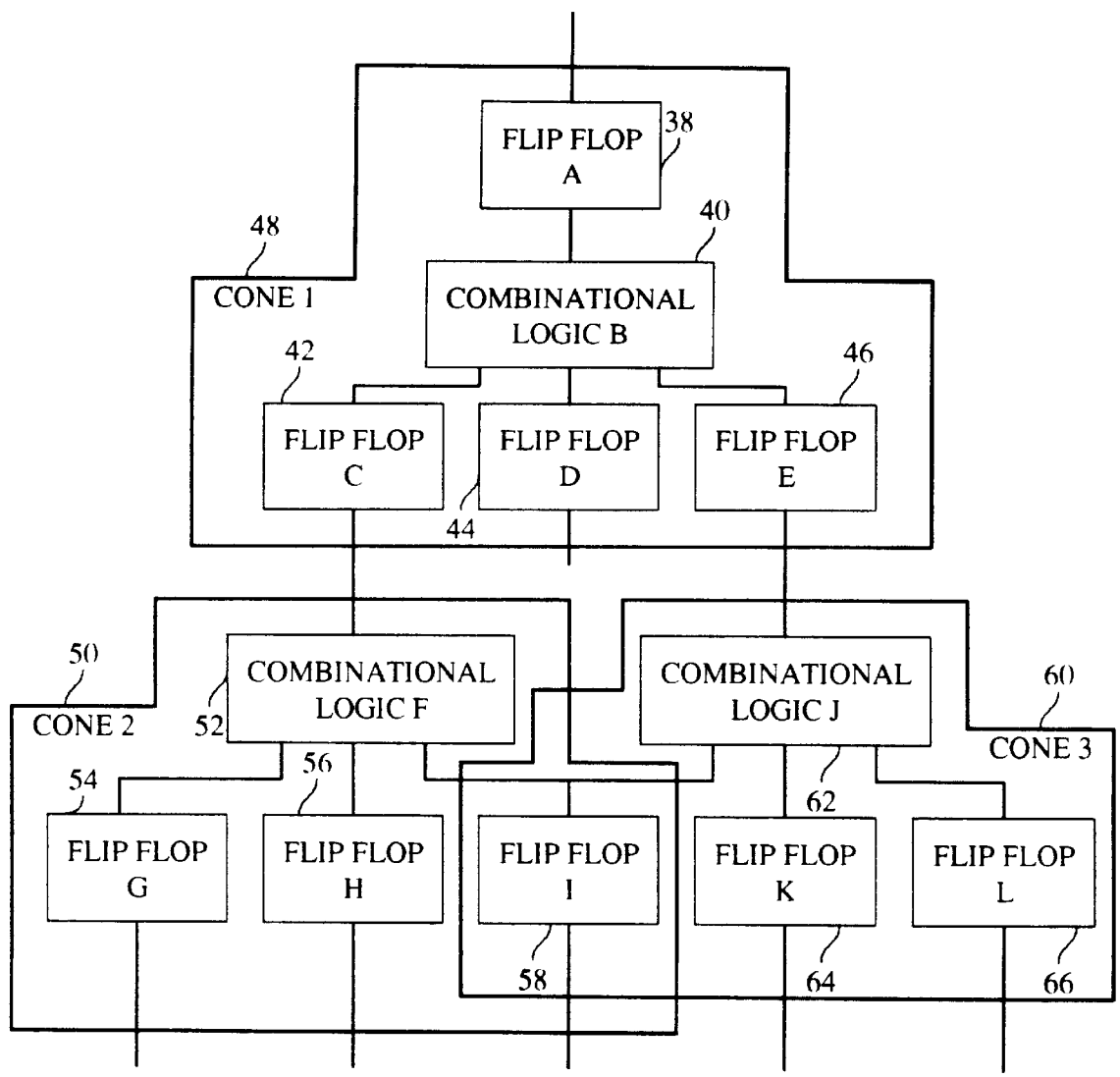
FIG. 3 is a diagram showing an example of partitioning logic cones within an integrated circuit.

FIG. 3 is a diagram showing an example of partitioning logic cones within an integrated circuit. First, a Flip-Flop A 38 is selected as an apex for a logic cone. All combinational logic feeding this Flip-Flop A 38 is identified (logically traced) and included in the cone, along with all flip-flops feeding the combinational logic. Thus, in FIG. 3, Flip-Flop A 38 is fed by Combinational Logic B 40, and Combinational Logic B 40 is fed by Flip-Flop C 42, Flip-Flop D 44, and Flip-Flop E 46. These components make up Cone 1 48. For test purposes, the selected Flip-Flop A 38 can be thought of as the "output" flip-flop, while the flip-flops feeding the combinational Logic B 40 are the "input" flip-flops. Similarly, Cone 2 50 is comprised of output Flip-Flop C 42, Combinational Logic F 52 and Flip-Flop G 54. Flip-Flop H 56, and Flop I 58. Cone 3 60 is comprised of output Flip-Flop E 46, Combinational Logic J 62 and Flip-Flop I 58, Flip-Flop K 64, and Flip-Flop L 66. Note that Flip-Flop I 58 is an input to two different cones. Also note that Flip-Flop C 42 and Flip-Flop E 46 appear as outputs for their own logic cones and inputs to Cone 1 48.

Figure 4:
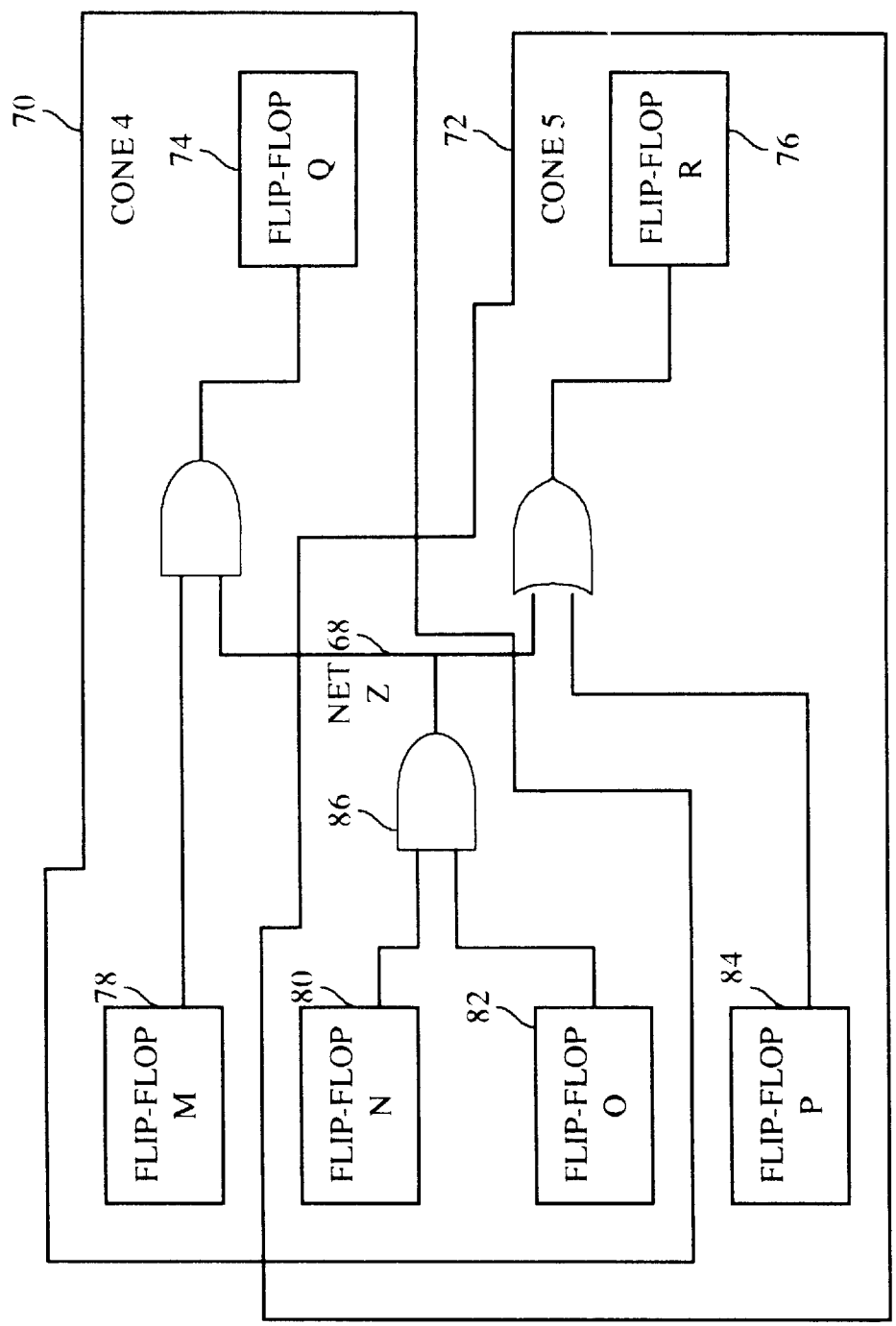
FIG. 4 is a diagram showing an example of two cones that are placed together in a partition.

Once the entire design is divided into cones, the cones are grouped together into sections of logic called partitions. A partition could, for example, consist of one hundred cones. Each partition is then submitted to the ATPG 34 of FIG. 2), which will generate test patterns for every net in the partition. When the ATPG generates test patterns, it begins by selecting a particular net in the selected partition. Obviously, the selected net will be part of at least one (but possibly more than one) cone in that partition. FIG. 4 is a diagram showing an example of two cones that are placed together in a partition. Note how Net Z 68 is a part of Cone 4 70 and Cone 5 72. Once a net is selected, the ATPG traces the logic forward to find the selected net's output flip-flop(s). If the net is part of more than one cone, the net will be associated with more than one output flip-flop. For example, in FIG. 4, Net Z 68 can be traced to output Flip-Flop Q 74 and output Flip-Flop R 76. For test generation purposes, the ATPG will select the output flip-flop which is most easily accessible based on predetermined ATPG criteria.

Next, the ATPG finds the input flip-flops associated with the selected output flip-flip. For example, in FIG. 4, if output Flip-Flop Q 74 is selected for Net Z 68, input Flip-Flop M 78, input Flip-Flop N 80, and input Flip-Flop O 82 will be used in the test pattern generation. Finally, the ATPG generates two patterns which can be scanned into Flip-Flop M 78, Flip-Flop N 80, and Flip-Flop O 82. One pattern detects a stuck-high condition for Net Z 68, while the other detects a stuck-low condition. Note that as a part of each pattern the ATPG also determines the enable and clock inputs needed to trap the results of the test pattern in Flip-Flop Q 74. The clock and enable logic is not shown in FIG. 4. During actual hardware test, each test pattern is scanned into the requisite input flip-flops. The necessary clock and enable signals are provided to the selected output flip-flop and the resulting signal is latched. Finally, the latched signal is scanned to an output pin for verification. This process is repeated for every test pattern generated for the partition.

A large ASIC design may consist of thousands of cones, and hundreds of partitions. Dividing the logic and then generating patterns for every partition in the design takes a large amount of processing time. The present invention decreases the time needed for partitioning and test pattern generation.

Figure 5:
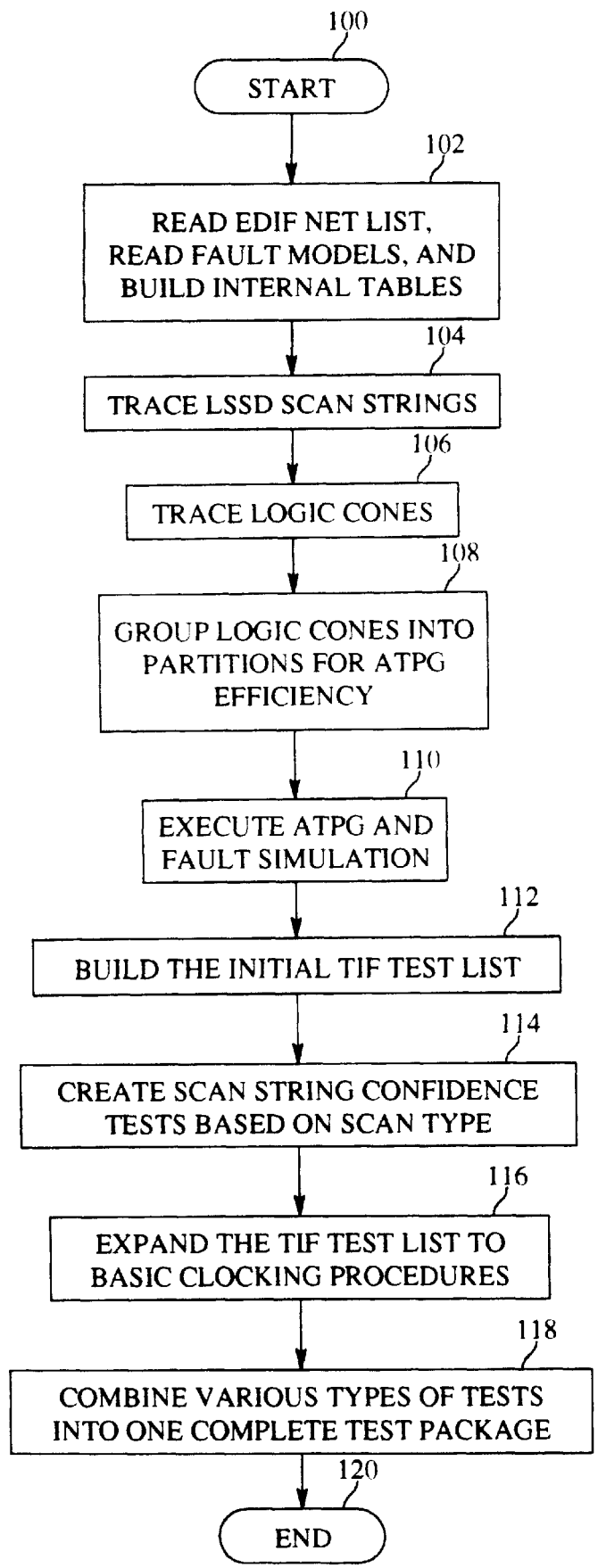
FIG. 5 is a flow chart illustrating the high level steps of ATPG processing.

FIG. 5 is a flow chart illustrating the high level steps of an ATPG process. After Start Step 100, three initialization tasks are performed at Step 102. An EDIF netlist is read from an external file, the fault models are read from an external file, and internal tables (data structures) are built for subsequent ATPG processing. In the preferred embodiment, only EDIF netlists are accepted. The EDIF netlist can be hierarchical or flat, and there can be one or many separate EDIF files describing the logical design of the integrated circuit. The design does not have to be an ASIC. The leaf level nodes and modules must have fault models for them. After reading in the EDIF netlist, at Step 104, the level sensitive scan design (LSSD) scan strings are traced at the fault model primitive level. For each scan string, all control signals are situated first, and then the scan path from a Scan Data Out (SDO) ASIC pin to a Scan Data In (SDI) ASIC pin is traced. The LSSD approach is one of several which allows the internal flip-flops to be indirectly observable by a maintenance processor or hardware tester. Once all of the scan-set and ASIC pin targets are identified, the logic that drives them are traced. Thus, at Step 106, all logic cones are traced. For cones where a scan-set latch is the apex, the functional/design logic and the scan string maintenance logic are traced.

Historically, each logic cone was traced individually. Because many cones share the same logic (See FIG. 4), that logic was traced many times over. In contrast, the present invention identifies all latches in a logical register and traces all of these latches as one logic cone. Identifying flip-flops that are part of the same logical register is accomplished by looking for vector nets that are driven by latches on a scan string. Using FIG. 4 as an example, one skilled in the art can readily see that Flip-Flops 80, 82, and node 86 would be traced twice if logic cones 4 70 and 5 72 were traced individually. They would be traced once if Flip-Flops Q and R were part of a logical register that was traced as one cone.

Fault assignment and design reports keep design logic and maintenance logic separate. Referring back to FIG. 5 at Step 108, compatible logic cones are grouped together into partitions based on logical registers. Each partition is given a name which is used in generated reports and can be used to interact with the ATPG program. Logic cones are grouped into partitions based on logical registers primarily to boost ATPG efficiency. The present invention is focused on creating partitions based on the logical registers within a design, not individual flip-flops or latches. By creating partitions that are identical to logical registers in a design, ATPG processing time is reduced and a more meaningful logic grouping is presented to the designer for further analysis. This step is accomplished by looking for vector nets that are driven by latches on a scan string.

At Step 110, patterns are created for each logic partition by executing an ATPG algorithm. The patterns are then fault simulated to determine which faults are detected by the pattern. The netlists for each partition are given to the ATPG and fault simulator one at a time. Test patterns are generated for the design logic only. At Step 112, the test patterns are translated into a Tester Independent Format (TIF). TIF is a robust proprietary language developed by Unisys Corporation. The language syntax allows for procedure calls, loops, and condition statements. The patterns created for each partition are placed into their own TIF section in the test list. Each section is flagged by the name of the partition. An advantage of the present invention is that all of the patterns in a TIF section exercise the logic driving one logical register. This makes failure analysis easier. At Step 114, a set of scan string confidence vectors are created. The vectors are in the TIF language format and placed into a file separate from the ATPG produced patterns. Vectors are created for every scan string. The vectors ensure each scan string is operating correctly. The patterns include all 0's, all 1's, sliding 0's and 1's, and a set of patterns to catch crosstalk. At Step 116, the TIF test list is expanded to a more basic set of clocking procedures. Since the TIF language has higher level procedures (like macro calls, condition statements, and loops), compilation of these calls produce simpler forms to match computerized testing equipment. At Step 118, different TIF test lists are combined into a custom test list. High level ATPG processing ends at End Step 120.

Figure 6:
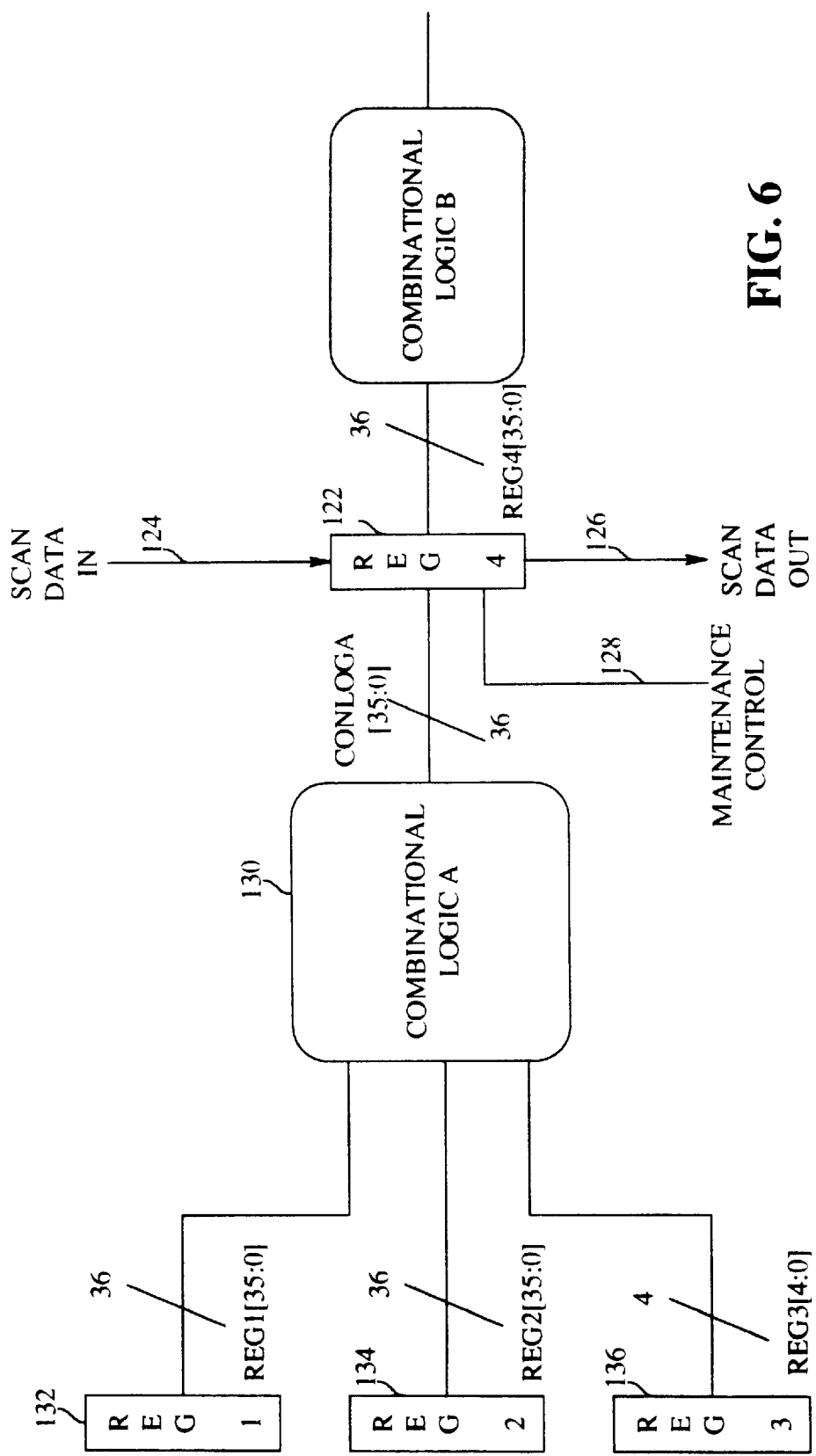
FIG. 6 is a diagram illustrating an example of using a logical register as the basis for a cone.

A logic designer frequently groups flip-flops with common functionality into structures called logical registers. FIG. 6 is a diagram illustrating an example of using a logical register as the basis for a cone. Register 4 (REG 4) 122 holds 36 bits of data. A scan string may be scanned in via Scan Data In line 124 and scanned out via Scan Data Out line 126 under the control of Maintenance Control line 128. Often, all of the flip-flops in a logical register share common clock and enables signals (not shown in FIG. 6), and are fed by a common body of combinational logic (such as Combinational Logic A 130). Moreover, many times a logical register drives a vectored net (i.e., a net labeled using vector notation). For example, in FIG. 6, the logical register REG 4 122 drives the vectored net "REG4[35:0]".

The present invention uses vectored-net notation to create logic cones based on an entire logical register, rather than single flip-flops. Hardware description languages allow vector notation to be used for grouping multiple internal states into logical registers. The knowledge of vector notation within a hardware description language and a general understanding of how that vector notation is used by logic designers is fundamental to register-based cone tracing. The present invention relies on the fact that designers use vector notation to group individual bits of logic state. All bits in this group share a common function and are usually referred to as a logical register. The present invention maintains meaningful names for logic nets driven by logical registers. For example, a logic designer may group 32 internal state bits together and refer to them as Register A. Using the vector notation of a hardware description language, a reference to all bits in the register would be REGISTERA[31:0] and a reference to an individual bit would be REGISTERA[6]. The register-based logic cone trace feature of the present invention specifically looks for this type of notation on the net names within a net list that describes the current integrated circuit device under test. Referring back to FIG. 6 for example, a cone may be formed by using logical register REG 4 122 as its basis. To form this cone, ATPG processing recognizes the net labeled "REG4[35:0]". It then forms a cone which includes every flip-flop driving this net including register REG 4 122). In addition, all compatible logic is included in the cone. Thus, in the example shown in FIG. 6, the cone would include REG 4 122, Combinational Logic A 130, Register 1 (REG 1) 132, Register 2 (REG 2) 134, and Register 3 (REG 3) 136.

Figure 7:
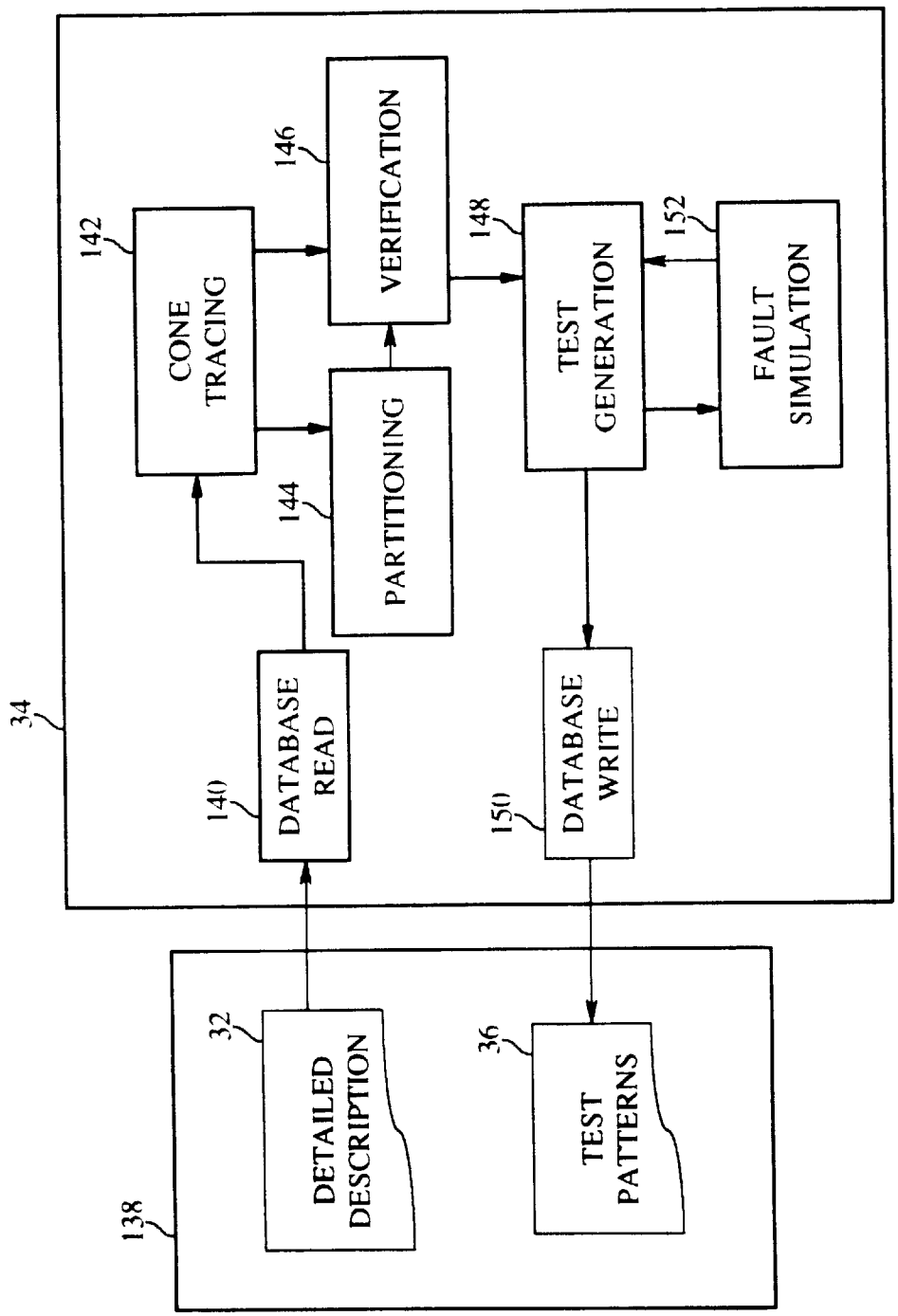
FIG. 7 is a block diagram of the major components of ATPG processing according to the present invention.

FIG. 7 is a block diagram of the major components of an ATPG process according to the present invention. All functions of the ATPG process 34 are executed by Processor 14 as part of the EDA System 12 from FIG. 1. The logic design of the integrated circuit contained in the Detailed Description 32 is read out of the Database 138 by Database Read function 140. The Database is resident in Memory 20 from FIG. 1. The data is input to the Cone Tracing function 142. The Cone Tracing function creates a cone by tracing back through the design from a selected logical register to one or more nets affecting the logical register. There may be many cones created for a given logic design. Further details of Cone Tracing are discussed below. Generally, the Partitioning function 144 groups cones into sections of logic called partitions. Each partition typically contains many cones. However, logical register cones as created by the present invention are not partitioned like one bit cones because a logical register cone is itself already considered to be a partition. Thus, avoiding the Partitioning step of the process saves a significant amount of processing time.

Many ATPG systems have partitioning features. The goal of partitioning is to group netlists of one bit logic cones together so that the size of the resulting netlist is the most optimum for test generation and fault simulation performance. Test generation and fault simulation algorithms have an exponential performance curve based on the number of gates/nodes in the netlist being processed. Partitioning based on logical registers also improves performance in two other ways. The first advantage of using logical register cone partitions is that it gives an ATPG tool more options/paths for propagating a potential fault to a cone apex. If there are many cone apexes to trace to, a path to a selected one of them may be very short and simple. The second advantage of using logical register cone partitions is that fault simulation of the ATPG pattern may catch many more faults than with a single bit logic cone. Existing partitioning algorithms make no attempt to place one bit cones from the same logical register into the same partition. Furthermore, attempts to group one bit cones after tracing of the individual logic cones is inefficient. Using traced logical register cones as partitions as in the preferred embodiment of the present invention improves overall ATPG system performance.

The Verification function 146 verifies that the logical register cones traced out during Cone Tracing 142 do not violate any Design For Test (DFT) rules. The Verification function also checks that the number of gates/nodes present in the logical register cones are not too large because extremely large netlists result in poor test generation and fault simulation performance. If, for any reason, the logical register cone is unusable, the logical register tracing is discarded and the logical register cone is retraced as individual cones or as several smaller logical register cones.

The Test Generation function 148 automatically generates appropriate test patterns to test for faults for each partition created by the Partitioning function 144. For logical register cones, the Test Generation function generates test patterns for each logical register cone. Test Generation 148 is given a netlist representing a partition and a list of fault sites. In the prior art, the partition is a single bit logic cone, but in the present invention, the partition is a logical register cone. Test Generation picks a fault (that has not yet been detected) from the list and creates a pattern that will excite that fault and propagate it to an output node of the netlist. When creating a pattern, Test Generation 148 is only concerned with that one fault. If Test generation operations are successful, the newly-created test patterns are stored into Test Patterns 36 in the Database 138 by Database Write function 148.

The task of the Fault Simulation function 152 is to fault simulate the test patterns against the entire netlist to determine all faults detected by each pattern. Detected faults are marked in a fault list and control is given back to Test Generation 148.

Several advantages are inherent in using a logical register cone as a partition represented by a netlist. A test pattern that loads bit 0 of a logical register must have the clock and enable active for the entire register. Simply using random values on all of the remaining data inputs to the logical register should result in values getting clocked into all bits of the register. This allows many faults to be detected with just one pattern. When creating a test pattern, Test Generation 148 can now find the easiest path. Commonly used Arithmetic Logic Unit (ALU) carry bits and parity trees may have easier paths to some bits in their capture registers, thereby providing operating efficiencies. Finally, the need for simulating patterns from a first partition on a second partition is reduced because it is unlikely that the first partition has logic in common with the second partition.

The Cone Tracing function 142 identifies all cones of the logic design. A logic cone includes all logic that drives a cone apex. A cone apex is any point in the integrated circuit (e.g., an ASIC) or any device under test (DUT) that can be observed directly or indirectly by a hardware tester. One point may be an ASIC external pin which is directly contacted by the hardware tester. The second point may be an internal logic state within an ASIC which can be indirectly observed and/or controlled by a hardware tester via the contacted ASIC pins. The internal logic states are controllable and observable because they are connected in a serial shift register configuration that is called a scan string. The scan string configuration usually has nothing to do with the intended function of the ASIC. Scan strings exist to allow a hardware tester to control and observe internal logic states.

Logic cone tracing involves starting from a cone apex and tracing backwards (i.e., the reverse of the functional logic flow) through all logic that drives the cone apex until controllable inputs are found. A controllable input is any ASIC pin or internal state that can be controlled by a hardware tester. As with an observable point, an internal state is a controllable input if it is on a scan string. The internal state on the scan string is controlled indirectly by the hardware tester via the ASIC pins.

Prior to performing the Cone Tracing function, the ATPG process 34 obtains important information from the netlist in the Detailed Description 32 and processing control scripts. Every scan string in the logic design is traced and every internal state that is observable and controllable from a scan string is identified. Every clock source is traced forward to every internal state to identify which clock source(s) drives each internal state.

Every internal state is traced forward to identify which net is the one that is used functionally. Obtaining the correct net name is critical to the success of register-based logic cone tracing. Library cells used as building blocks for complex circuitry usually have more than one output port/terminal. Some ports may only be used to drive the next bit on the scan string.

Figure 8:
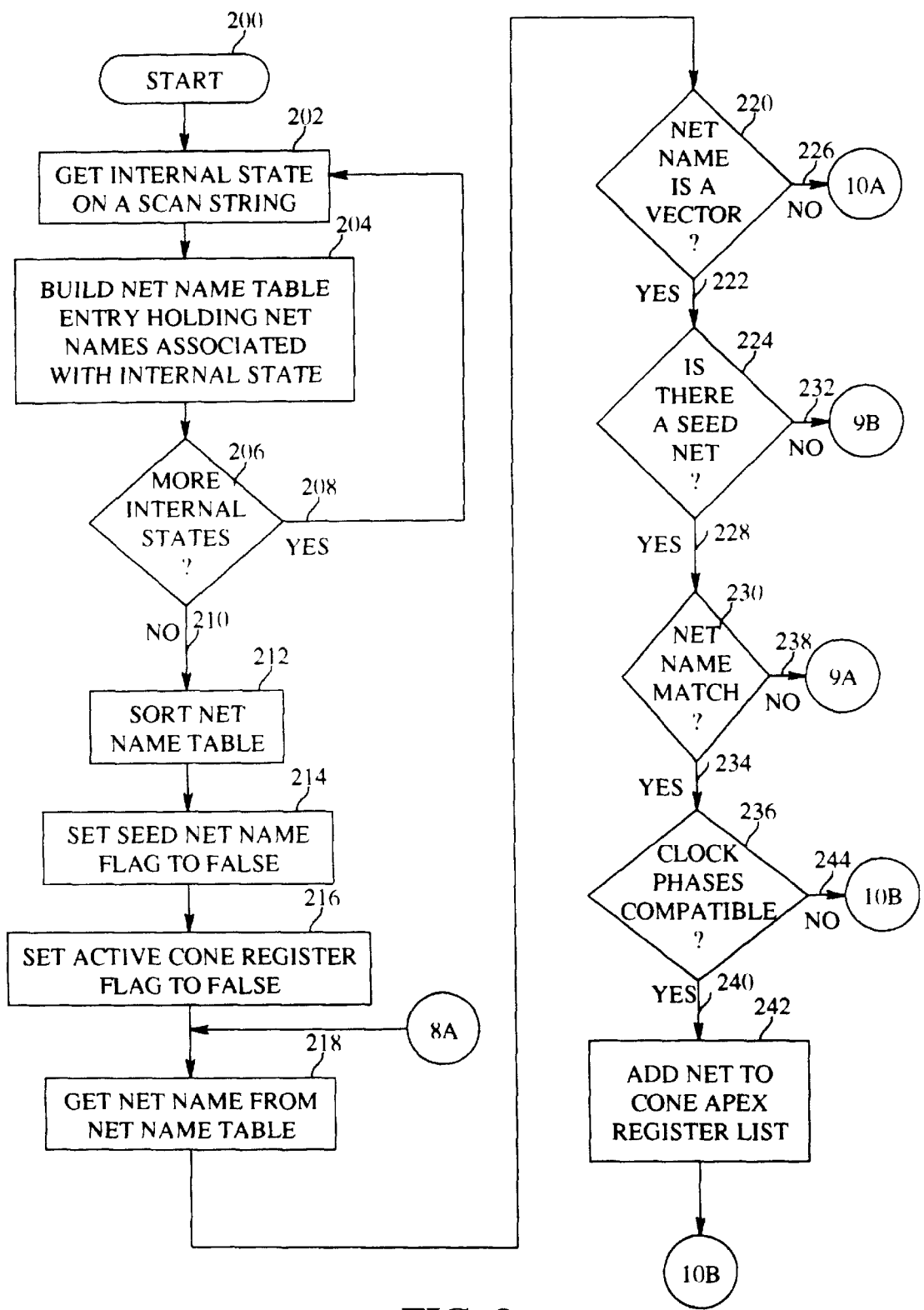
FIGS. 8–10 are flowcharts showing the steps for building the list of logical registers to be traced.
Figures 9A, 9B:
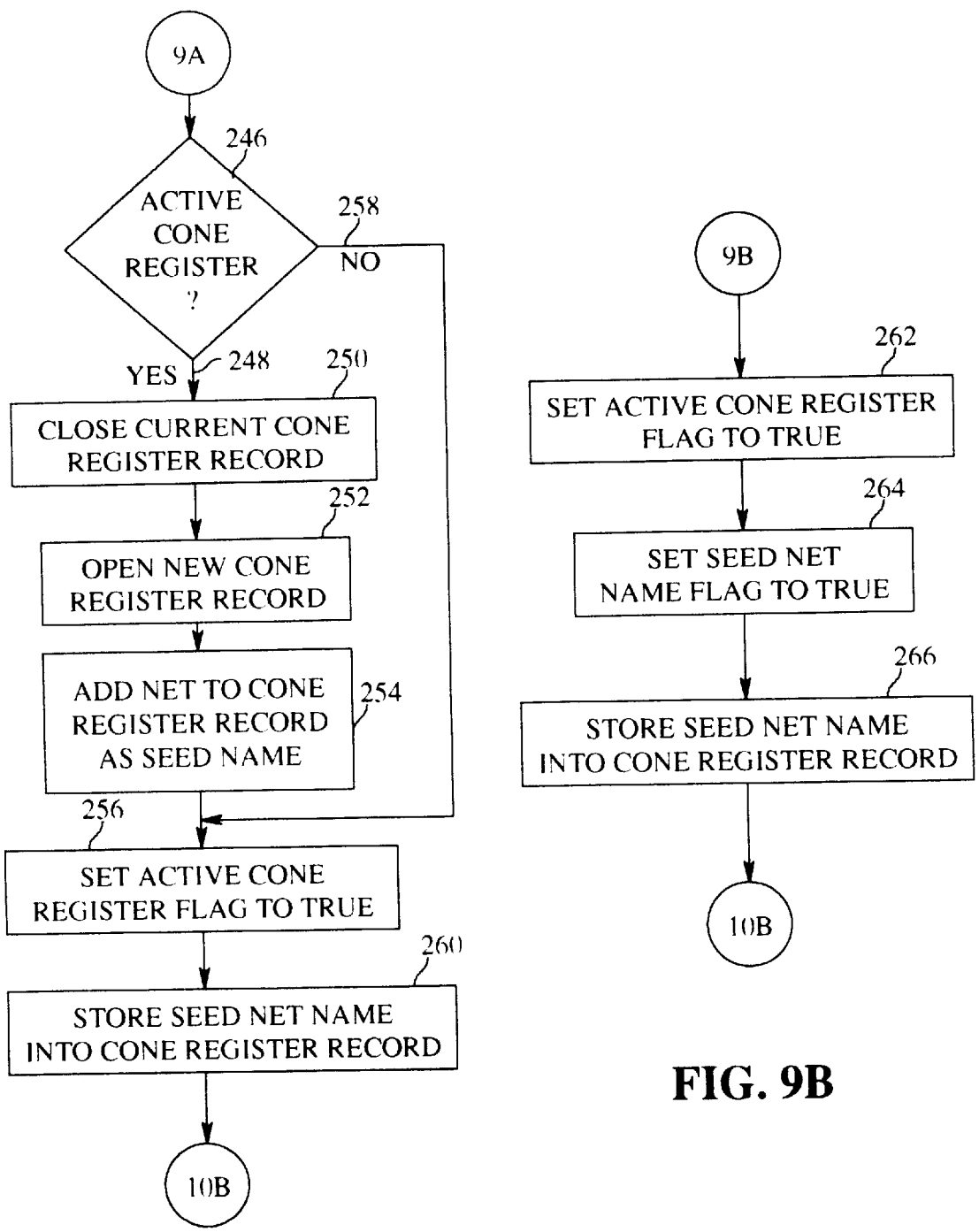
Figure 10:
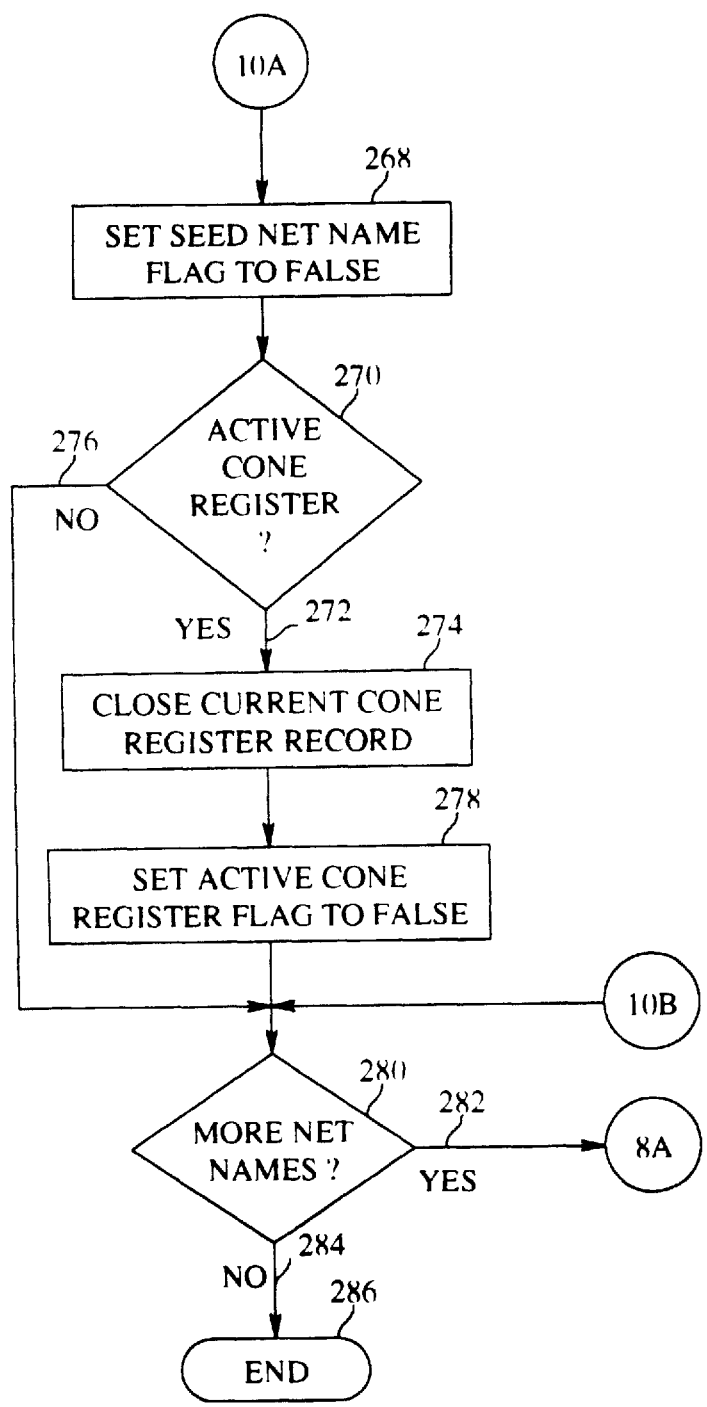

FIGS. 8–10 are flowcharts showing the steps for building the list of logical registers to be traced. After Start Step 200 Cone Tracing 142 loops through all internal states that are on a selected scan string. Thus, at Step 202, an internal state of a scan string is obtained. At Step 204, a Net Name Table entry is created to hold the net names associated with the current internal state. These net names contain the names that are meaningful to the logic designer. Using FIG. 6 as an example, the net names associated with each Flip-Flop in REG 4 122 are nets REG4[35:0]. If there are more internal states in the logic design to process (Test Step 206), then Yes path 208 is taken back to Step 202 to process another internal state. Otherwise, No path 210 is taken to Step 212, where the completed Net Name Table is sorted to promote subsequent processing efficiency. The sorted list contains all nets driven by scan set Flip-Flops. Two boolean flags are used to control processing for building a list of logical registers to be traced. The first flag is the Seed Net Name Flag. It indicates whether a "seed" net name is being processed. The Seed Net Name Flag is set to false at Step 214, indicating that there is no "seed" net name.

The second flag is the Active Cone Register Flag. It indicates whether an "active" cone register is being built. The Active Cone Register Flag is set to false at Step 216, indicating that no active cone register is being built.

After the sorted Net Name Table is constructed, Cone Tracing processing loops through each entry. At Step 218, a net name is obtained from the Net Name Table. If the net name is a vector (Test Step 220), then Yes path 222 is taken to Test Step 224, else No path 226 is taken and Cone Tracing processing continues on FIG. 10 via connector 10A. At Test Step 224, if there is a "seed" net, then Yes path 228 is taken to Test Step 230, else No path 232 is taken and processing continues on FIG. 9 via connector 9B. A seed net is the first net found after commencement of identification of all nets that are part of the same logical register. As looping through the net list takes place, each net is compared to the seed net to determine if they are in fact part of the same logical register. When a net is found that does not match the seed net (for example. REG3[0]), the current register record (for REG4) is closed, a new register record is opened and the new net (REG3[0]) is placed as the seed net for the new record. Thus, as looping through the list of nets continues, all other nets that are part of the logical register REG3 (such as REG3[1], REG3[2], etc.) are found and placed into the REG3 record. After all nets have been processed and all nets that are part of a logical register are identified, a list of cone apexes exists that can be used for logic cone tracing.

At Test Step 230, if the net name matches the seed net name (vector notation is considered "wild card" characters), then Yes path 234 is taken to Test Step 236, else No path 238 is taken and processing continues on FIG. 9 via connector 9A. At Test Step 236, a quick check for garbage collection registers is made by determining if the clock phases are compatible. If they are, Yes path 240 is taken to Step 242, else No path 244 is taken and processing continues on FIG. 10 via connector 10B. At Step 242, the current net name is added to a cone apex "register" list being built. Cone Tracing processing continues on FIG. 10 via connector 10B.

Turning now to FIG. 9, No path 238 leads to connector 9A. If there was no net name match, then Test Step 246 is performed. If the Active Cone Register Flag is set to true, then Yes path 248 is taken to Step 250. At Step 250, the current cone register record data structure is closed. A new cone register record is opened at Step 252 and the current net name is added to the record at Step 254. Processing then continues at Step 256. If the Active Cone Register Flag is not set to true, then No path 258 is taken to Step 256. At this step, the Active Cone Register Flag is set to true. At Step 260, the seed net name is stored into the cone register record. Processing of this thread then continues on FIG. 10 via connector 10B. No path 232 from FIG. 8 leads to connector 9B. At Step 262, the Active Cone Register Flag is set to true. Next, the Seed Net Name Flag is set to true at Step 264. At Step 266, the seed net name is stored into the cone register record. Processing continues on FIG. 10 via connector 10B.

No path 226 on FIG. 8 leads to FIG. 10 via connector 10A. At Step 268, the Seed Net Name Flag is set to false. At Test Step 270, if the Active Cone Register Flag is set to true, then Yes path 272 is taken to Step 274, else No path 276 is taken. At Step 274, the current cone register record is closed. At Step 278, the Active Cone Register Flag is set to false. At Test Step 280, if more net names of the Net Name Table need to be processed, then Yes path 282 is taken back to FIG. 8 via connector 8A. Otherwise, No path 284 is taken to End Step 286, and the list of registers to be traced is complete. A new list of nets now exists with all bits in a logical register being grouped together.

Figure 11:
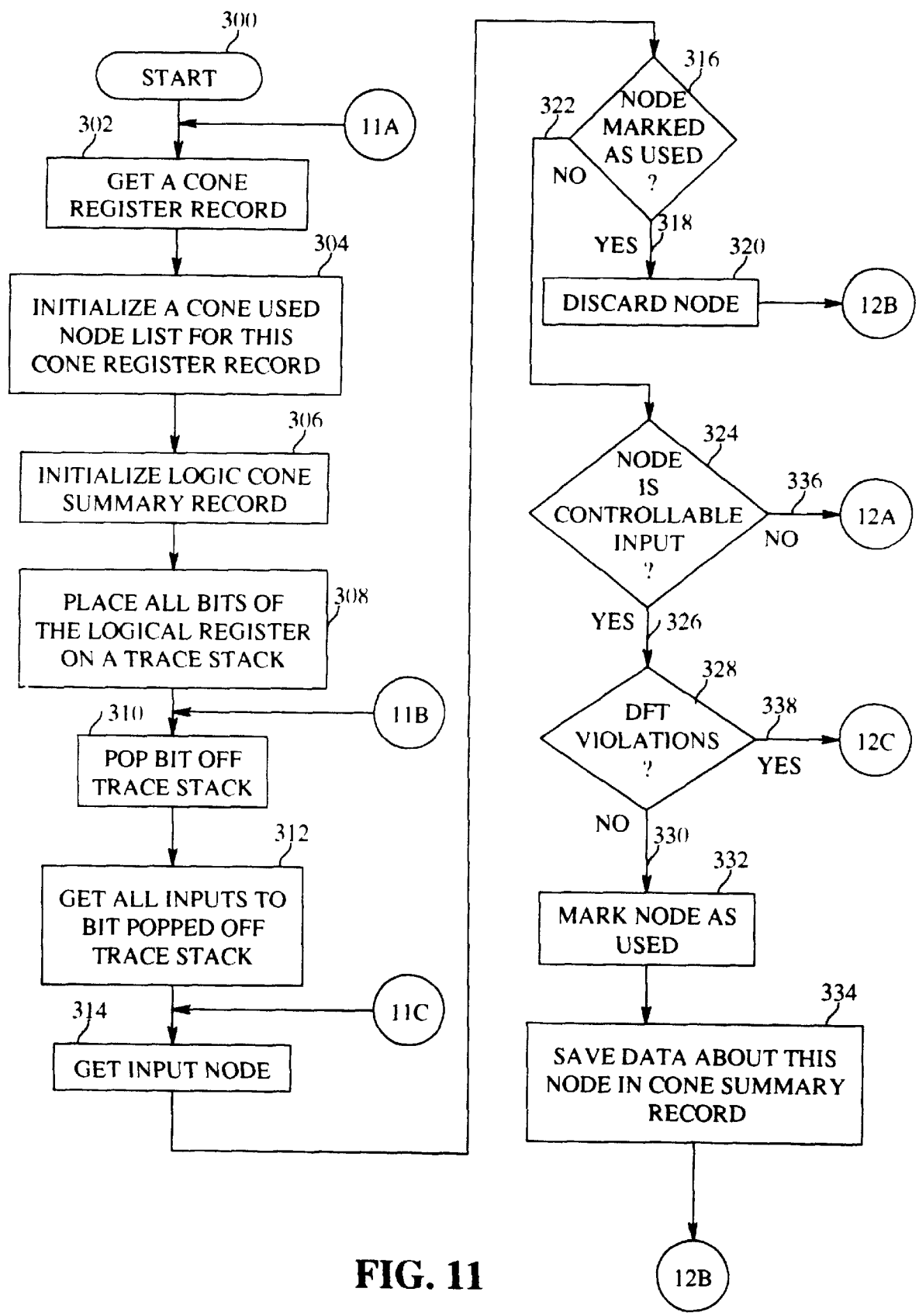
FIGS. 11 and 12 are flowcharts showing the steps for tracing logical register cones.
Figure 12:
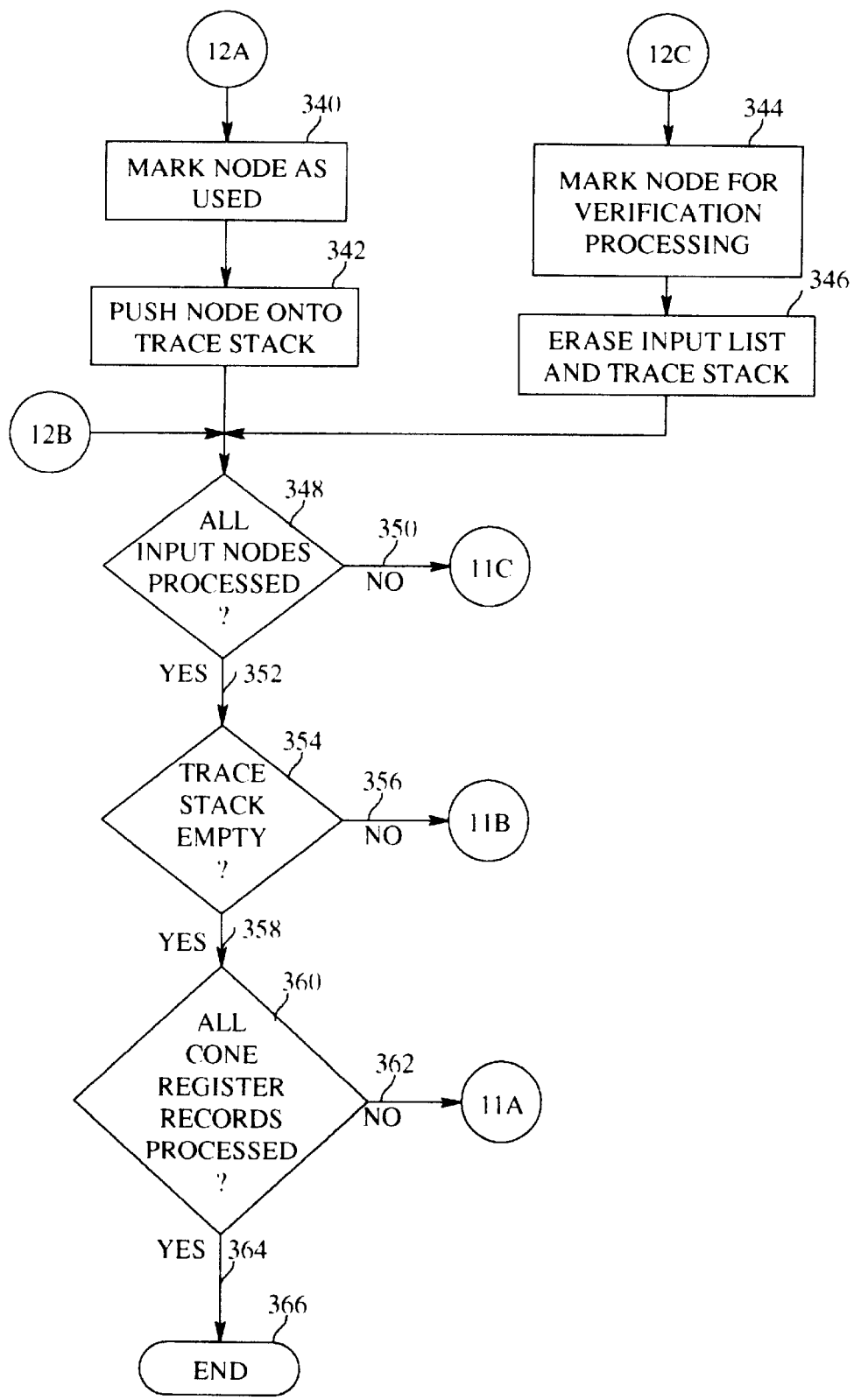

After the above processing, the internal logic states have been grouped into logical registers based on the vector net notation of the logical nets that each internal state drives. An entire logical register cone can now be traced instead of each bit individually. Figures 11 and 12 are flowcharts showing the steps for tracing logical register cones. Cone Tracing processing loops through all cone register records constructed during the list building steps described above. After Start Step 300, a cone register record is obtained for tracing processing at Step 302. A cone Used List is initialized for the current cone register record at Step 304. A cone register record exists even for single bit cones. At Step 306 a logic cone summary record is initialized (even for single bit cones). Next, at Step 308 all bits of the logical register for the current cone register record are pushed onto a trace stack data structure.

Cone Tracing then processes all bits until the stack is empty. At Step 310, a bit of the logical register is popped off the trace stack. All inputs to the current bit just popped off the trace stack are identified at Step 312. Next, Cone Tracing loops through all inputs (i.e., all of the nodes driving the bit that was popped off the trace stack). At Step 314, an input node is obtained. If the node is marked as used (Test Step 316), then Yes path 318 is taken to Step 320, where the node is discarded and processing continues on FIG. 12 via connector 12B. If the node is not marked as used, then No path 322 is taken to Test Step 324. If the node is a controllable input (e.g., a scan set latch or an ASIC pin), then Yes path 326 is taken to Test Step 328. At this test, if no Design For Test (DFT) violations have been encountered, then No path 330 is taken to Step 332. The node is marked as used at Step 332 and data about this node is save in the cone summary record at Step 334.

Cone Tracing processing continues on FIG. 12 via connector 12B. If the node is not a controllable input at Test Step 324, then No path 336 is taken to FIG. 12 via connector 12A. If a DFT violation has been detected at Test Step 328, then Yes path 338 is taken to FIG. 12 via connector 12C.

Turning now to FIG. 12, No path 336 from FIG. 11 leads to Step 340. At this Step, the current node is marked as used. Next, at Step 342 the node is pushed onto the trace stack. Yes path 338 from FIG. 11 leads to Step 344. At this Step, the node is marked for future verification processing. At Step 346, the input list and the trace stack are erased because of the DFT violation. There is no need to perform further processing on this trace. Processing continues with Test Step 348. If all input nodes have not been processed, then No path 350 is taken back to Step 314 on FIG. 11 via connector 11C. Otherwise, Yes path 352 is taken to Test Step 354. If the trace stack is not yet empty, then No path 356 is taken back to Step 310 on FIG. 11 via connector 11B. Otherwise. Yes path 358 is taken to Test Step 360. If not all cone register records have been processed, then No path 362 is taken back to Step 302 on FIG. 11 via connector 11A.

Otherwise, Yes path 364 is taken to End Step 366, where logic register cone tracing ends.

Dividing the logic design of the integrated circuit according to the present invention provides several advantages. First, it allows logic cone tracing to be completed more efficiently. In previous designs, cones were formed by tracing the logic starting with a single flip-flop. Often, however, the same body of combinational logic drives all bits of a logical register. This is particularly true with arithmetic logic, where a carry bit is involved. Thus, a duplicate tracing effort was performed for every bit in the logical register structure. With the present invention, all bits of a logical register are traced simultaneously, avoiding duplicate tracing efforts. Therefore, overall performance of ATPG processing is enhanced. In some cases, tracing time has been reduced to as much as one thirtieth of previous tracing times. Second, dividing logic based on logical registers improves the efficiency of the ATPG. When an ATPG processes a partition, it must "discover" the clock and enable signals, then generate the clock and enable patterns needed to load data into the output flip-flops. Prior methods divide logic according to flip-flops, so the clock and enable patterns are re-generated for each bit in a selected logical register. In contrast, the present invention divides logic according to logical registers. Since all bits in a logical register will share common clock and enable signals, the clock and enable patterns need only be generated once for all bits in the logical register structure. Therefore, the performance of the ATPG is improved. Finally, partitioning by logical registers allows the ATPG to generate reports that are more readable to the logic designer or test engineer because the reports list logical register and vectored net names rather than flip-flop identifiers. The level of description of components and nets is effectively raised for fault analysis purposes. By creating logic cones and partitions based on logical registers, both the partitioning itself, and the subsequent test pattern generation can be completed more efficiently.

The invention has been described in its presently contemplated best mode, and clearly it is susceptible to various modifications, modes of operation and embodiments, all within the ability and skill of those skilled in the art and without the exercise of further inventive activity. Accordingly, what is intended to be protected by Letters Patent is set forth in the appended claims.

We claim:

1. In a system used by a logic designer for designing and testing an integrated circuit, the logic design of the integrated circuit including a gate-level description expressed in a predetermined format and having net names for representations of nets of the integrated circuit and component names for representations of components of the circuit including combinational logic circuits and state devices, the nets of the integrated circuit including first nets input to the integrated circuit, second nets output from the integrated circuit, and third nets internal to the integrated circuit, with predetermined vectored ones of the nets having net names specified by vector net notation to denote a predetermined functional relationship, a method of partitioning the logic design of an integrated circuit and generating test patterns for testing the integrated circuit comprising the steps of:

grouping the representations of slate devices which drive the predetermined vectored ones of the nets into logical registers according to the net names of the predetermined vectored ones of the nets;

creating a plurality of cones of logic design of the integrated circuit, each of said plurality of cones including a section of the logic design of the integrated circuit including at least one of said logical registers, all included ones of the combinational logic circuits which are driving said at least one of said logical registers, and all state devices driving one or more of said included ones of the combinational logic circuits; and automatically generating test patterns for each one of said plurality of cones.

2. In a system used by a logic designer for designing and testing an integrated circuit, the logic design of the integrated circuit including a gate-level description having net names for representations of nets of the integrated circuit and component names for representations of components, components of the circuit including combinational logic circuits and state devices, nets of the integrated circuit including first nets input to the integrated circuit, second nets output from the integrated circuit, and third nets internal to the integrated circuit, with predetermined ones of the nets being vectored nets which are specified by vector net notation, a method of partitioning the logic design of an integrated circuit and generating test patterns for testing the integrated circuit comprising the steps of:

(a) identifying ones of the state devices of the integrated circuit which drive the vectored nets;

(b) grouping said component names of said ones of the state devices into logical registers according to the net names of the vectored nets;

(c) creating a plurality of cones of logic design of the integrated circuit, each of said plurality of cones including a section of the logic design of the integrated circuit including at least one of said logical registers of the logic design, all included ones of the combinational logic circuits driving said at least one of said logical registers, and all state devices driving one or more of said included ones of the combinational logic circuits;

(d) verifying that said plurality of cones traced during step (c) comply with predetermined design rules and that the number of components in each one of said plurality of cones is less than a selected number; and (e) automatically generating test patterns for each one of said plurality of cones.

3. The method of claim 2, further including the step of:

(f) fault simulating said test patterns to determine if all faults occurring in the integrated circuit are detected by said test patterns.

4. In a system used by a logic designer for designing and testing an integrated circuit, the system including a computerized database for storing a gate-level description of the logic design of the integrated circuit and test patterns for testing the integrated circuit, the gate-level description including component names for representations of components and net names for representations of nets of the integrated circuit, components of the integrated circuit including state devices and combinational logic circuits, nets of the integrated circuit including base nets input to the integrated circuit and apex nets output from the integrated circuit, predetermined vectored ones of the nets being vectored nets which are specified by vector net notation, a method of partitioning the logic design of an integrated circuit and generating test patterns for testing the integrated circuit comprising the steps of:

(a) electronically reading the gate-level description of the logic design of the integrated circuit from the computerized database;

(b) building a list of logical registers by grouping representations of the state devices which are driving predetermined ones of the vectored nets into said logical registers based on vector net notation of said predetermined ones of the vectored nets;

(c) tracing a cone of logic design for each of said logical registers in said list of logical registers, each said cone of logic design including at least one of said logical registers, all included ones of the combinational logic circuits which are driving said at least one of said logical registers, and all state devices driving said included ones of the combinational logic circuits;

(d) verifying that each said cone of logic design traced during step (c) complies with predetermined design rules and that the number of components in each said cone of logic design is less than a selected number;

(e) automatically generating test patterns for each said cone of logic design;

(f) fault simulating said test patterns to determine if all faults occurring in the integrated circuit are detected by said test patterns; and (g) storing said test patterns in the computerized database.

5. In combination with a digital integrated circuit having components and nets, components of the circuit including combinational logic circuits and state devices, the nets of the digital integrated circuit including first nets input to the digital integrated circuit and second nets driven by the state devices, predetermined ones of the nets having a vector net name specified by vector net notation, a system used by a logic designer for partitioning the logic design of the digital integrated circuit and for generating test patterns for testing the digital integrated circuit comprising:

tracing means for creating a list of driving ones of the state devices which are driving the predetermined ones of the second nets which are specified by vector net notation, for sorting said list into logical registers based on the vector net name of the net driven by each of said driving ones of the state devices, and for creating a plurality of cones of logic design of the digital integrated circuit, each of said plurality of cones including at least one of said logical registers, all included ones of the combinational logic circuits which are driving said at least one of said logical registers, and all state devices driving said included ones of the combinational logic circuits; and test pattern generation means for automatically generating test patterns for each one of said plurality of cones.

6. The system of claim 5, further including:

fault simulation means for fault simulating said test patterns to determine if all faults occurring in the integrated circuit are detected by said test patterns.

7. The system of claim 5, further including:

verification means for verifying that said plurality of cones comply with predetermined design rules and that the number of components in each one of said plurality of cones is less than a selected number.

8. An electronic design automation system used by a logic designer for designing and testing a digital integrated circuit, the electronic design automation system including a computerized circuit design database for storing a gate level description of the logic design of the digital integrated circuit, the gate level description including names for representations of components and representations of nets of the digital integrated circuit, the components including combinational logic circuits and state devices, nets of the digital integrated circuit including base nets input to the digital integrated circuit and apex nets output from the state devices of the digital integrated circuit, predetermined ones of the apex nets having vector net names specified by vector net notation, the electronic design automation system comprising:

a processor;

a storage device coupled to said processor for storing the computerized circuit design database; and software means operative on said processor for partitioning the logic design of the digital integrated circuit and generate test patterns for testing the digital integrated circuit by:

(a) electronically reading the logic design of the digital integrated circuit from the computerized circuit design database;

(b) creating a plurality of logical registers of the digital integrated circuit by grouping representations of state devices that drive the predetermined ones of the apex nets according to the vector net names;

(c) creating a plurality of cones of logic design from the logic design of the digital integrated circuit, each of said plurality of cones of logic design including at least one of said logical registers, all included ones of the combinational logic circuits driving said at least one of said logical registers, and all state devices driving said included ones of the combinational logic circuits;

(d) grouping said plurality of cones of logic design into a plurality of partitions, each one of said plurality of partitions including at least one of said plurality of cones of logic design;

(e) automatically generating test patterns for each one of said plurality of partitions; and (f) storing said test patterns for testing the digital integrated circuit into the computerized circuit design database.

9. An electronic design automation system used by a logic designer for partitioning the logic design of an application specific integrated circuit (ASIC) according to predetermined design rules, and for generating test patterns for testing the ASIC, comprising:

a computerized ASIC design database means for storing a gate level description of the logic design of the ASIC, said gate level description including names for components and nets of the ASIC, said components of the ASIC including combinational logic circuits and state devices, said nets of the ASIC including base nets input to the ASIC and apex nets output from said state devices, predetermined vectored ones of said apex nets having vector net names specified by vector net notation;

reading means for reading the logic design of the ASIC from said computerized ASIC design database means;

cone tracing means coupled to said reading means for creating a list of ones of said state devices driving said predetermined vectored ones of said apex nets, for sorting said list into logical registers based on said vector net names of said predetermined vectored ones of said apex nets, and for creating a plurality of cones of logic design from the logic design of the ASIC, each of said plurality of cones of logic design including at least one of said logical registers, all included ones of said combinational logic circuits which are driving said at least one of said logical registers, and all state devices driving said included ones of said combinational logic circuits;

partition means coupled to said cone tracing means for grouping said plurality of cones of logic design into a plurality of partitions, each one of said plurality of partitions including at least one of said plurality of cones of logic design;

test pattern generation means coupled to said partition means for automatically generating test patterns for each one of said plurality of partitions;

fault simulation means coupled to said test pattern generation means for fault simulating said test patterns to determine if all faults occurring in the ASIC are detected by said test patterns;

verification means for verifying that said plurality of cones of logic design comply with the predetermined design rules and that the number of said components in each one of said plurality of cones of logic design is less than a selected number; and means coupled to said test pattern generation means for writing said test patterns into said computerized ASIC design database.

\* \* \* \* \*